United States Patent [19]
Lin

[11] Patent Number: 5,216,235
[45] Date of Patent: Jun. 1, 1993

[54] OPTO-MECHANICAL AUTOMATIC FOCUSING SYSTEM AND METHOD

[75] Inventor: Shih-Chao Lin, Taipei, Taiwan

[73] Assignee: Amray, Inc., Bedford, Mass.

[21] Appl. No.: 873,361

[22] Filed: Apr. 24, 1992

[51] Int. Cl.[5] .......................... G01J 1/20; G01N 21/86
[52] U.S. Cl. ................................. 250/201.6; 250/561;
250/306; 250/311; 356/375
[58] Field of Search ................. 250/561, 201.3, 201.4,
250/201.5, 201.6, 216, 234–236, 559–560, 548,
571, 306, 311; 356/375, 445;
219/121.78–121.81, 121.83

[56] References Cited

U.S. PATENT DOCUMENTS

| | | | |
|---|---|---|---|
| 3,937,959 | 2/1976 | Namae . | |
| 4,207,467 | 6/1980 | Doyle | 356/445 |
| 4,230,940 | 10/1980 | Minami et al. | 250/201.3 |
| 4,356,392 | 10/1982 | Wittekoek et al. | 250/561 |
| 4,363,962 | 12/1982 | Shida | 250/201.3 |
| 4,558,949 | 12/1985 | Uehara et al. | 250/561 |
| 4,698,513 | 10/1987 | Tojo et al. | 250/561 |
| 4,990,776 | 2/1991 | Fushimi et al. . | |
| 5,124,562 | 6/1992 | Kawashima et al. | 356/375 |

FOREIGN PATENT DOCUMENTS 2217158 10/1989 United Kingdom .

OTHER PUBLICATIONS

"An Automatic Focusing and Astigmatism Correction System for the SEM and CTEM", Journal of Microscopy, Vol. 127, Part 2, Aug. 1982 (pp. 185–189).

"Techniques for High Speed SEM Wafer Inspection for Production Applications" SPIE, vol. 1087, Integrated Circuit Metrology, Inspection and Process Control III (1989) (pp. 17–29).

*Primary Examiner*—David C. Nelms
*Assistant Examiner*—Michael Messinger

[57] ABSTRACT

The disclosed apparatus comprises a charged particle beam system and method including a particle beam generator for forming a beam of electrons, ions or other charged particles and for directing the beam along a predetermined axis to a focal point. Object support means support an object on the particle beam axis with the focal point on a surface of the object. There is provided an optical beam system forming part of an autofocusing system for maintaining the relative positions of the beam generating means and the object support means along the particle beam axis. The optical beam system comprises means for developing an optical beam, and means for directing the optical beam transversely to the particle beam axis and at an acute angle to the object surface. Means are provided for forming an optical beam first focus on a surface of the object. Optical image forming mirror means collects radiation from the optical beam first focus and forms a beam second focus in the vicinity of the beam first focus such that a change in the height or vertical position of the object surface along the particle beam axis produces a change in the position of the second focus indicative of the object surface height or position change.

27 Claims, 8 Drawing Sheets

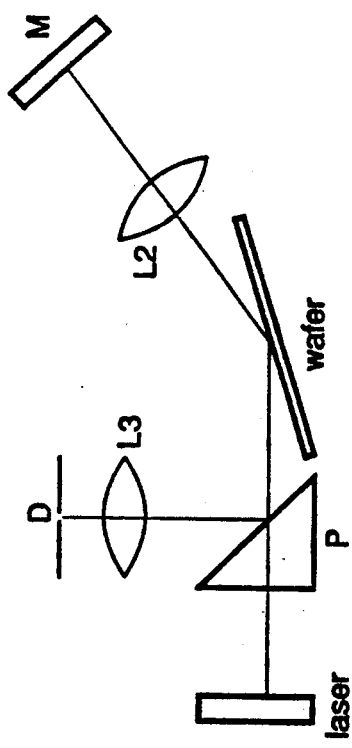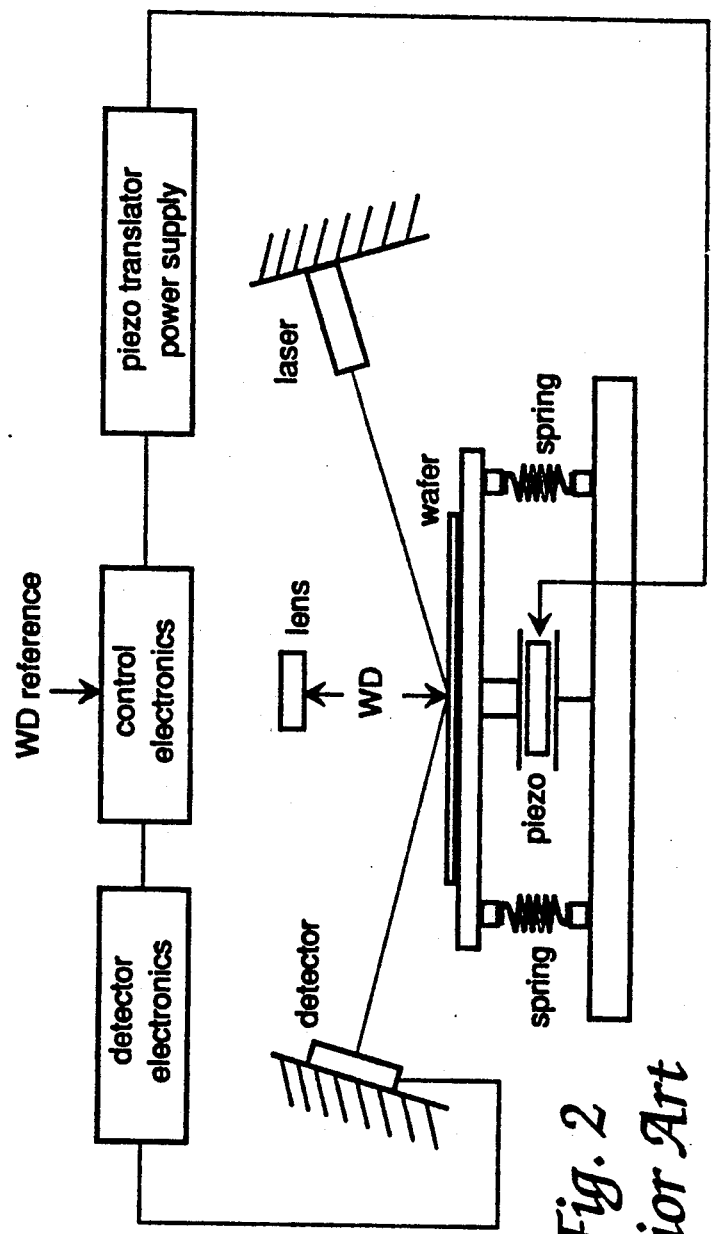
Fig. 1 Prior Art
Fig. 2 Prior Art

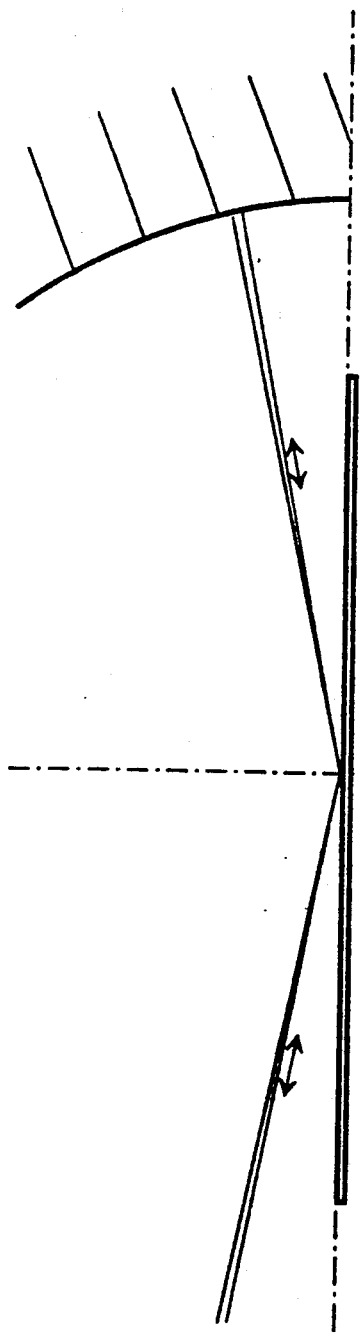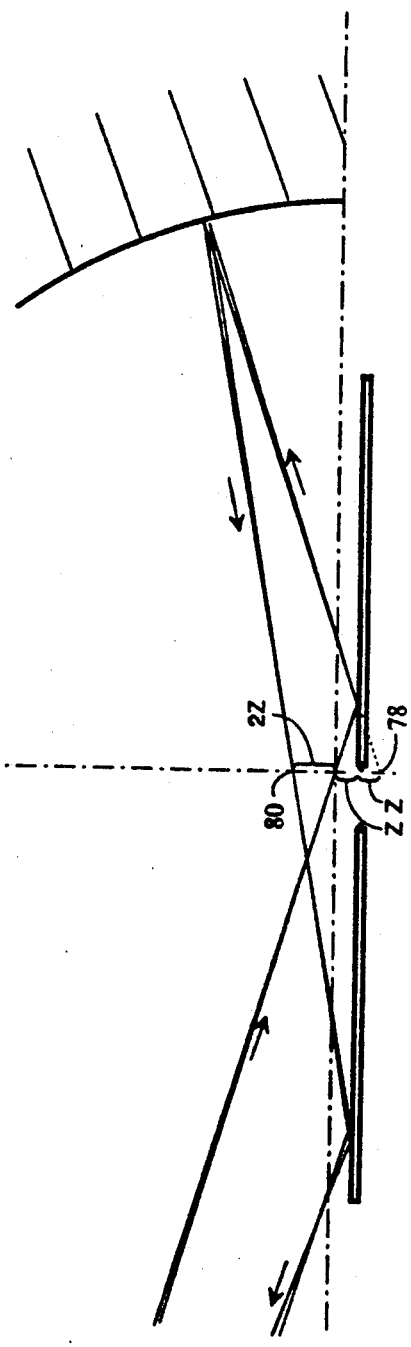

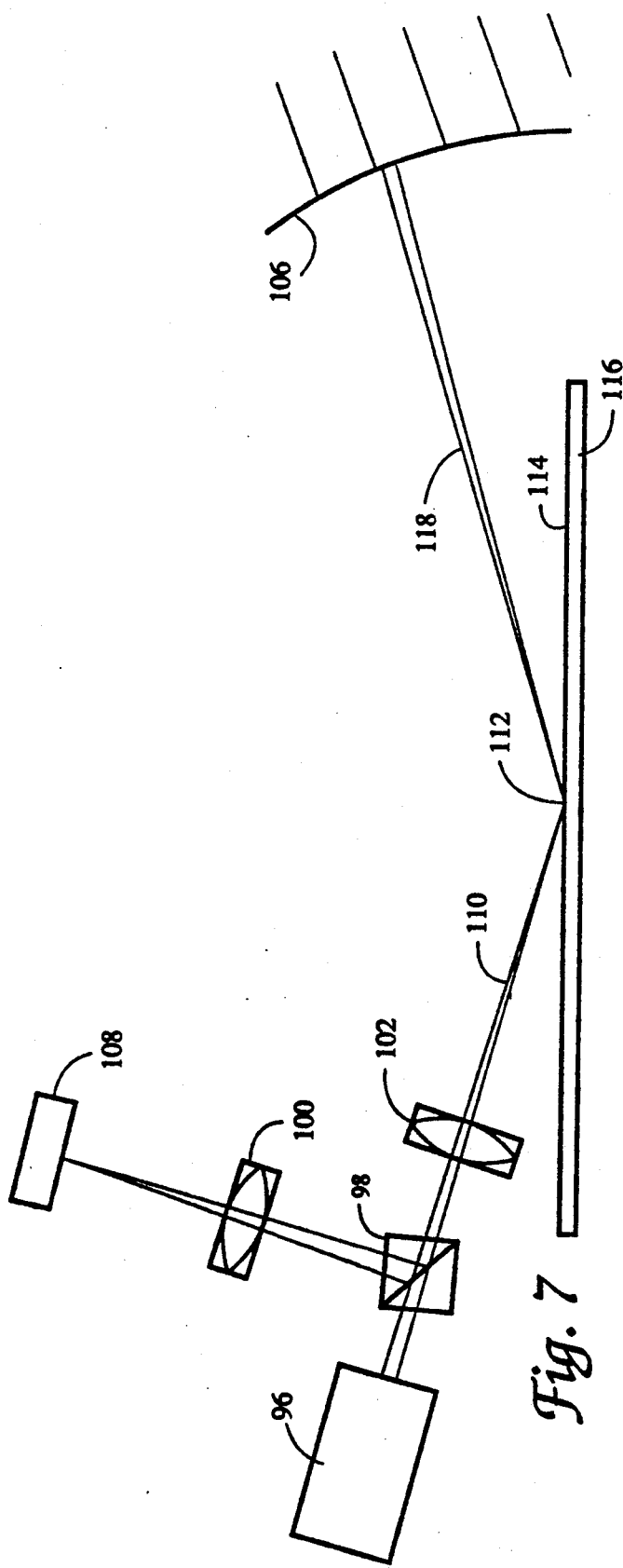
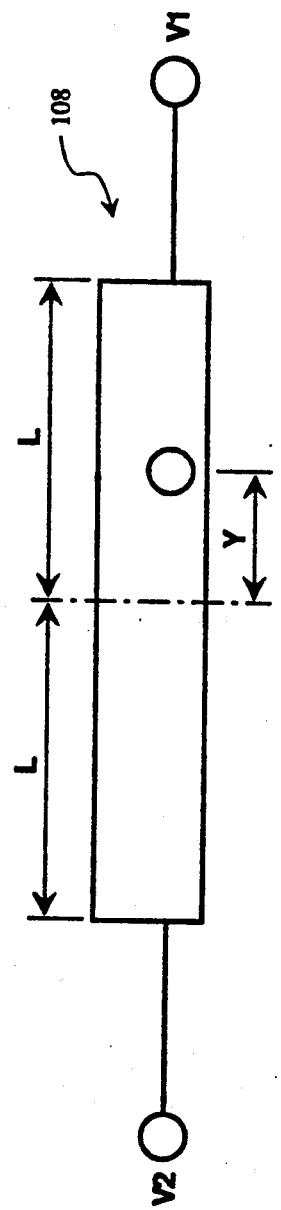

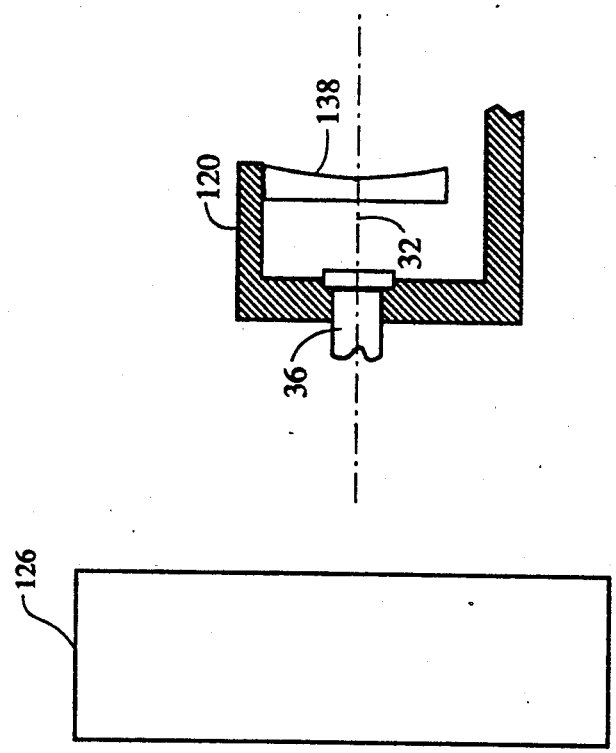
Fig. 14
Fig. 13
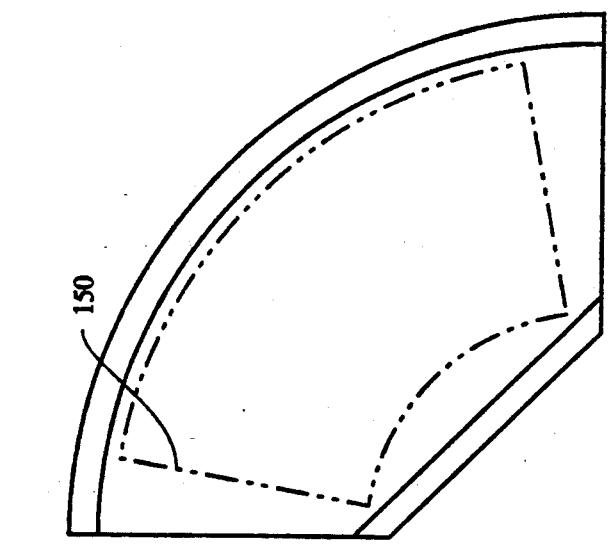
Fig. 12
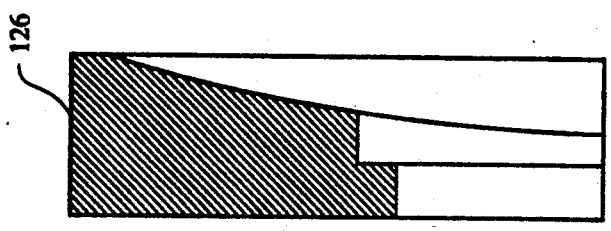
Fig. 11

OPTO-MECHANICAL AUTOMATIC FOCUSING SYSTEM AND METHOD

BACKGROUND OF THE INVENTION

This invention concerns an opto-mechanical system for detecting the height or position of a light reflective surface of an object. The system is useful in a variety of applications, including automatic focusing systems for probe-forming charged particle devices such as electron microscopes.

While the present invention is not limited to automatic focusing systems for electron microscopes, by way of example the present discussion will be in that context.

Manual focusing and stigmating of an electron microscope is time consuming, requires extensive training, and may not be consistent.

Automatic focusing improves througout, replaces the operator, can be more consistent (through improved precision), and requires no training. In the case of CD SEMs, throughput with operator focus is limited, but with automatic focusing according to this invention it can be significantly greater.

Automatic focusing approaches for electron beam microscopes may be classified into systems which:

1. Change the focus of the system objective or final lens in response to detected changes in the object surface height or position. The best focus is determined by processing the video signal.

The disadvantages of this approach are that it requires a good sample structure and a good video signal. It also usually requires re-stigmating after lens adjustment. Magnification will change and magnification errors may be introduced as a result of magnetic hysteresis.

2. Change the beam voltage instead of the final lens focus. The disadvantages of this latter approach are that it requires a good sample structure and a good video signal. It usually also requires re-stigmating. Magnification will change, and significant kV change may occur. If the sample height changes by 500 microns, kV will change from 1000 volts by as much 100 volts at a 5 mm focal length.

3. Move the sample up or down to a preset, stable, focus of the electron optics. The advantages of this approach are that there will be no change in magnification, beam voltage or stigmation. There will be no magnification error due to magnetic hysteresis. Focusing is similar to that done in a light microscope.

A number of techniques have been pursued in the past for deriving information indicative of the location of the examined object surface.

As described by Erasmus and Smith in their article, "An Automatic Focusing and Astigmatism Correction System for the SEM and CTEM", Journal of Microscopy, Volume 127, Part 2, August 1982, pages 185-189, a number of approaches have been attempted for automatic focusing of a scanning electron microscope (SEM). These are said to fall into one of two categories: those that determine the point of best focus from the derivative or gradient of the video signal, and those that analyze the power spectrum or diffraction pattern of the signal.

Erasmus and Smith also describe previous automatic focusing sytems for the CTEM (conventional transmission electron microscope). The earliest description of a focusing aid for a CTEM was the "wobbler" in which the parallax caused by tilting the illuminating beam produced an image shift which could be detected by the operator.

Attempts have been made to convert the CTEM image int an electrical signal and then to determine the defocus of the image from the power spectrum of the signal. Still other approaches involving electronic processing of a derived electrical signal are described by Erasmus and Smith.

U.S. Pat. No. 3,937,959 discloses a method for automatically focusing the electron beam of a scanning electron microscope which method involves adjusting the focal length of the electron beam condenser lens system as the beam is scanned and monitoring the output of detecting means for various scans to determine a minimum beam diameter.

British Patent No. 2,217,158 concerns automatic focusing apparatus for an electron microscope which monitors an integrated video signal for various values of objective lens current as that current is ramped through its range. Problems are described which result from lag and hysteresis. A solution is presented wherein the lens current is ramped up and down between its limits, integrated maxima are detected, and the lens current ramped up and down using these maxima as the new limits. The process is repeated until the range is sufficiently reduced such that the currents producing the maxima for the last two passes may be averaged to yield the correct focusing value.

Fushima et al, U.S. Pat. No. 4,990,776, alludes to such prior art systems. "Since it is necessary to irradiate the specimen with the electron beam several times until the in-focus position is attained, the specimen is subjected to damage and charging by the electron beam, thereby making it impossible to correctly detect a pattern when a semiconductor device or the like is to be observed, measured, and/or checked", (column 1, line 58).

Fushima et al describes a system which avoids use of the electron beam itself in the autofocusing process. In the Fushima et al system an optical beam is developed and focused on the object at the location of the electron beam focus. The electron beam system is automatically focused without the need to irradiate the object with the electron beam.

Fushima et al, however, suffers from a number of shortcomings associated with the way in which the optical beam and electron beam systems are integrated. The optical beam is folded onto the electron beam axis. By the use of a Schmidt-type imaging system, the optical beam is focused to a point coincident with the electron beam focus The electron beam must be passed through an opening in the convex reflector of the optical imaging system. The result is a system in which neither the optical system nor the electron beam system can be optimized for maximum performance. The working distance of the device is fixed or extremely restricted. The Fushima et al system requires projection of an optical pattern on the object through the electron beam system. Further, the Fushima et al system is of questionable use in applications where it is desired to tilt the object, or wherein the object has a highly irregular surface topography.

An automatic electron beam focusing system is described in an article by Guillermo Toro-Lira entitled "Techniques for High Speed SEM Wafer Inspection for Production Applications", SPIE, Volume 1087, Integrated Circuit Metrology, Inspection and Process Control III (1989), pages 17-29. FIGS. 9 and 10 of the Toro-Lira system are reproduced as FIGS. 1 and 2 hereof. In the Toro-Lira system, a laser beam is focused on a wafer at the point of electron beam impingement (electron beam not shown). The reflected beam is collected by lens L2, reflected off a flat mirror M and reimaged onto the first focus by lens L2. See FIG. 1.

A beam splitter P directs the reflected beam into a lens L3 which images the second focus onto a detector D. As shown in FIG. 2, a signal derived from the detector is processed through "detector electronics", "control electronics" and "piezo translator power supply". The output from the power supply is supplied to a piezoelectric Z-translator which adjusts the position of the wafer in accordance with changes in the height of the wafer surface as detected by the optical system so as to maintain the wafer surface at a fixed location.

The Toro-Lira system has a fixed operating distance, with no provision for making gross adjustments in the operating distance. However, a truly useful automatic focusing system for an electron microscope must be able to accommodate a wide range of operating distances—that is, the distance between the objective or final lens of the electron optical system, and the surface of the specimen or object. The system must be able to accommodate objects of various thicknesses and topographical characteristics, electron optical systems having various focal lengths, and various arrangements of XYZ stages.

Secondly, a system for use in semiconductor wafer inspection, for example, must be capable of accommodating wafer tilts as great as 60 degrees. By the nature of the optical system of the Toro-Lira device, tilt of the wafer greater than a few degrees could not be tolerated.

It is believed that the Toro-Lira system will not readily accommodate an object surface having a "potato-chip" or otherwise wavy or irregular surface, as the reflected laser beam would not be collected with satisfactory efficiency.

OBJECTS OF THE INVENTION

It is an object of the present invention to provide an optical system and method for detecting the position or height of the surface of a specimen or object in optical surface inspection systems, opto-mechanical autofocusing systems, and the like.

It is another object to provide such an autofocusing system and method for probe-forming charged particle devices which is extremely simple in construction and use, yet which is highly accurate in its detection of variations in the position or height of the surface of an object.

It is another object to provide such a system and method which can accommodate a wide range of gross adjustments in operating distance between a particle beam final lens and the object in order to permit use of various objects, X-Y-Z motion stages and particle beam focusing optics.

It is still another object of the invention to provide such an optical system and method for use with focused charged particle systems which is extremely flexible and versatile in use, accommodating object tilt angles of 60 degree or greater.

It is yet another object of the present invention to provide a high precision optical surface inspection system which is simple in structure and operation, and which is capable of examining with high efficiency objects whose surface topography is tilted, wavy, or highly irregular or distorted.

It is yet another object of the invention to provide an autofocusing system and method for focused charged particle systems such as electron beam microscopes, in which the autofocusing system and the electron beam system are not spatially integrated, avoiding any need to compromise performance, serviceability or other characteristic of the either system in order to accommodate the other.

It is another object of this invention to provide an opto-mechanical automatic focusing system and method in which the sample (wafer, for example) is moved up or shown to a preset, stable, focus of the electron optics in response to detected changes in the object surface height or position.

It is yet another object to provide such an opto-mechanical system and method which does not require sample structure since it does not use the video signal to determine an out-of-focus condition, working well on unpatterned wafers and other samples.

It is an object to provide such a system and method which will place the sample surface to a preset focus plane with an accuracy of plus/minus 2 microns or less.

It is yet another object to provide an opto-mechanical autofocusing system and method whose function is not compromised in use with objects having highly irregular surfaces.

BRIEF DESCRIPTION OF THE FIGURES

FIGS. 1 and 2 are reproductions of figures from a prior art disclosure discussed in the background of the invention;

FIGS. 4, 5, and 6 are illustrative diagrams useful in understanding the theory underlying certain aspects of the present invention;

FIG. 7 is a highly schematic simplified illustration of the FIG. 3 system, depicting key elements in the novel system;

FIG. 8 is an illustration useful in understanding the functioning of a detector employed in connection with the illustrated invention;

FIGS. 11, 12 and 13 show details of a spherical mirror shown in FIG. 3 and

FIG. 14 is an alternative embodiment of the FIG. 3 system which employs a 360 degree spherical mirror.

DESCRIPTION OF THE PREFERRED EMBODIMENTS

Figure 3:
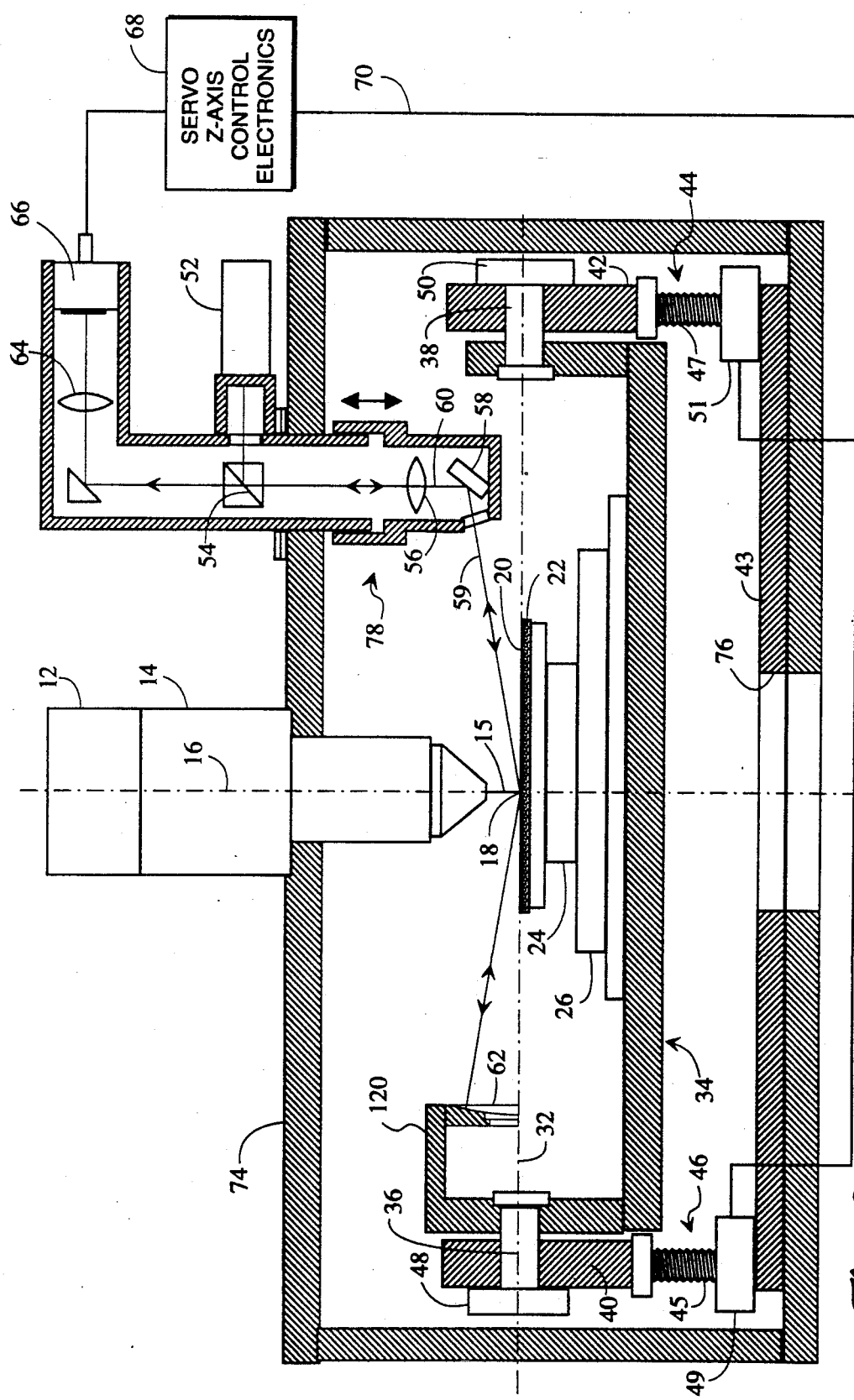
FIG. 3 illustrates an opto-mechanical automatic focusing system for an electron microscope constructed in accordance with the teachings of the present invention.
Figure 4:
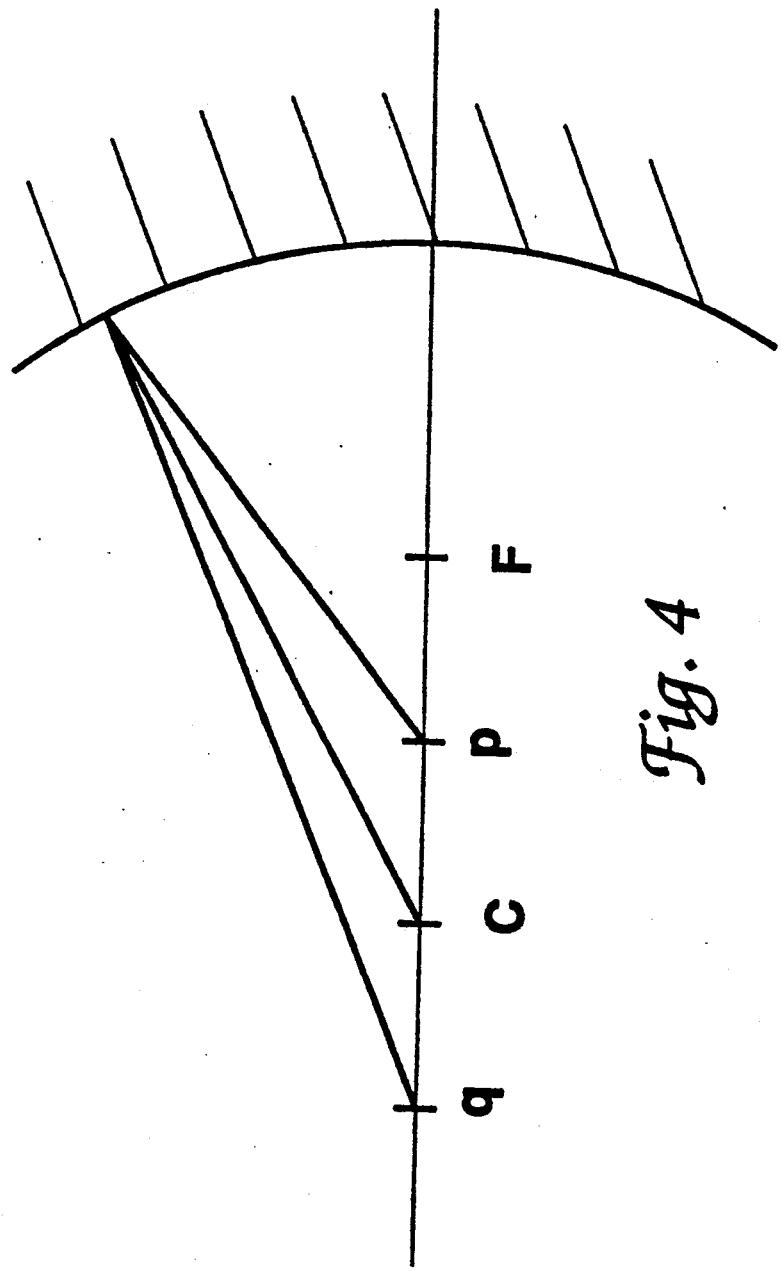

This invention concerns an opto-mechanical system for detecting the height or position of a light reflective surface of an object. FIG. 3 schematically illustrates a system implementing the principles of the present invention.

Referring now to the FIG. 3 system, there is provided a probe-forming charged particle beam system, here shown as a scanning electron microscope. The microscope comprises a gun 12 having a field emission electron source, and an electron optical column 14 having a low chromatic abberation 60 degree conical objective lens, for example. The gun 12 and the column 14 together form a beam 15 of electrons. The beam 15 is directed along an electron beam axis 16 and converged to a focal point 18 on a surface 20 of an object or specimen, here shown as a semiconductor wafer 22. Object support means are shown as comprising an X-motion stage 24 and a Y-motion stage 26. The X and Y motion stages 24, 26 are illustrated in highly schematic form and may in practice comprise any of a variety of conventional electromechanical or mechanical translatory devices The object support means further comprises a tilt stage by which the wafer 22 may be tilted about a tilt axis 32.

As will be described in more detail hereinafter, it is a prime object of this invention to provide an optomechanical system useful with focused charged particle devices which accommodates wafer tilting through an extreme range of angles. More specifically, the tilt stage is shown as comprising a cradle 34 mounted for angular movement on trunions 36, 38 in upright base members 40, 42 supported by a horizontal base 43. Tilt motors 48, 50 are provided for selectively varying the tilt angle of the cradle 34 and thus of the wafer 22.

In accordance with another very important object of the present invention, the cradle 34 and the supported X-motion stage 24 and Y-motion stage 26 are adjusted in Z-axis position for the purpose of changing the operating distance between the object and the electron optics of the column 14.

Specifically, there are shown parallel Z-motion stages 44, 46 for varying the position of the cradle and contained wafer 22 along the Z-axis.

The Z-motion stages 44, 46 are illustrated in highly schematic form as comprising screws 45, 47 driven by precision motors 49, 51. As will be described in more detail hereinafter, the Z-motion stages comprise part of a servo system for maintaining the surface 20 of wafer 22 at a prescribed position on the Z-axis, and are capable of making gross and fine adjustments in the Z-position of a specimen or object.

In accordance with the present invention, an autofocusing system is coupled to the object support means for adjusting the position of the support means along the particle beam or "Z" axis.

The autofocusing system includes a novel optical beam system comprising means for developing an optical beam, here shown as a laser 52. A 45 degreee semireflective mirror 54, lens 56 and mirror 58 direct the optical beam 15 from the laser 52 transversely to the particle electron beam axis 16 and at an acute angle to the surface 26 of the wafer 22. The mirror 54, lens 56 and mirror 58 act on the beam to form a first optical beam focus on a surface of the wafer 22, preferably approximately coincident with the focal point 18 of the electron beam.

As will be described in detail hereinafter, an optical image forming mirror means, preferably a spherical mirror 62, collects radiation from the optical beam first focus and forms a second focus in the vicinity of the beam first focus. A change in the height or position of the wafer surface 20 along the electron beam axis 16 produces a change in the position of the second focus formed by the mirror 62 indicative of the wafer surface height or position change.

Radiation from the second focus produced by the mirror means 62 reflects off mirror 58, and is imaged by lens 56 and lens 64 onto an image-position-sensitive detector 66.

The output of detector 68 is supplied to servo Z-axis control electronics system which derives a DC correction voltage related to the magnitude of the error sensed in the height or position of the wafer surface 20. The DC correction signal is supplied by a line 70 to the Z-motion stages 44, 46 for making a corrective zero-seeking adjustment in the Z-position of the inspected surface 20 of wafer 22. The loop cycles until the inspected wafer surface is at the nominal preset operating distance, which distance corresponds with the proper focal plane of the electron optical system in column 14.

The gross adjustments in the position of the object can be made by injecting a DC bias voltage into the feedback loop A vacuum enclosure is shown schematically at 74, including a port 76 through which the vacuum chamber may be evacuated.

DESIGN THEORY

For a better understanding of the theory underlying the present invention, reference may be had to FIGS. 4-8. The present design is based on the basic optical phenomenon that the conjugate of a point source at the center of curvature of a spherical concave mirror is itself See FIG. 4. In other words, with a spherical concave mirror, if a light beam is directed from point source "C" at the center of curvature onto the spherical concave mirror, the beam will be imaged back on the center of curvature point "C". A point source at "p" on the optical axes would have an image at point "q", and a source at "q", an image at "p".

When the point source is at a point which is some distance off the optical axis, the reflected beam would form a real image at the the same off axis distance but on the opposite side of the optical axis.

Hence, for a point source at the center of curvature reflected by a wafer surface at the same point and onto a spherical concave mirror, the second image or focus would be coincident with the point source or first focus. See FIG. 5. If the wafer is displaced by distance "Z", the beam reflected from the wafer creates a virtual point source 78 at twice the "Z" distance away from the optical axis and on the same side thereof. The image 80 of the virtual point source 78 is formed at 2Z away from the optical axis and on the opposite side thereof. See FIG. 6.

Although this design theory is discussed with reference to focusing on a semiconductor wafer, other materials and surfaces could be used, such as semiconductor photo masks, computer hard disks, mirrors, etc.

As shown in FIG. 7, the basic system in simplified form consists of a laser 96, beam splitter 98, lenses 100, 102, spherical concave mirror 106 and detector 108.

The optical path of the optical beam system is as follows. The collimated light beam 110 from the laser 96 is brought to a focus 112 at the point of interest on the surface 114 of object 116 by achromatic lens 102. Within limits, the detection accuracy of the system increases with decreasing angle of beam incidence. An acceptable angle of incidence is in the order of 15 degrees.

The focal point or first focus 112 of the lens 102 on the surface 114 of the object 116 becomes a new point source for the spherical mirror 106.

The light beam 118 emanating from the point source or first focus 112 is received by mirror 106 which forms a new image point or second focus on or in the vicinity of the first focus, as the spherical mirror 106 has its center of curvature at the focus 112. The second focus preferably falls within about 200 microns from the first focus.

If the point of interest on the surface 114 of the object 116 is moved a "Z" distance away, the image point or second focus formed by mirror 106 would be off-axis and twice the "Z" distance from the optical axis, as discussed above.

The second focus is imaged on a photo-sensitive surface of the detector 108 by lenses 100, 102, and beam-splitter 98. As will be explained, and as is well known in the art, the detector 108 is capable of generating a signal indicative of the position of the second focus image formed on a photo-sensitive surface thereof. See FIG. 8.

From the output of the detector 108, the position of the light spot on the detector surface away from the center of the detector may be found. Using one of the positions as a reference point, the system measures the movement of the object surface away from the reference. With a motorized Z-motion stage or stages, the autofocusing system brings the point of interest on the surface 114 of the object 116 back to the reference plane.

A suitable detector 108 is the DSP IL5 manufactured by SiTek Electro Optics of Portille, Sweden and distributed in the United States by Ontrack Photonics. The position of the light spot on the detector is determined by the of formula: $y=(V1-V2)/(V1+V2) * L$ where y is the distance away from the center, V1 and V2 are the voltages measured at either end of the detector, and L is half the length of the detector surface. Any suitable one-dimensional or two-dimensional position-sensing type detector may be used with this system.

Although V1 and V2 depend on the intensity of the light beam, the ratio of the difference to the sum of V1 and V2 does not depend on the intensity of the light shining on the detector. Since L is a constant, the measurement is not a function of the intensity of the light as long as the intensity of the light beam is enough to register on the detector.

It is an important object of this invention to provide an opto-mechanical focused particle beam autofocusing system which can accommodate a wide range of gross adjustments in operating distance between the particle beam final lens and the object.

Referring again to FIG. 3—in accordance with one implementation of the invention, to achieve this objective, the spherical mirror 62 is mechanically coupled or secured to the object support means so as to move therewith to maintain the second focus on the object surface during any adjustments in the "Z" position of the object. Specifically, the spherical mirror 62 in the FIG. 3 system is supported on upright base member 40 by a cantilevered beam 120. As the cradle 34 is elevated or lowered along the Z-axis, the spherical mirror 62 moves with it so that the center curvature of the mirror 62 will always be at the point of interest on the surface of wafer 22.

It is another important object of the present invention that the incidence angle of the optical beam 60 be maintained relatively constant, despite gross adjustments in the position of the object.

In accordance with an aspect of the present invention, the means for directing the optical beam and for forming a first optical beam focus has an adjustable optical path length. As briefly noted above, such means are shown very schematically as the telescoping arrangement 78. In practice, a lead screw would be provided to adjust the path length, or a micrometer could be employed.

Thus by mounting the spherical mirror 62 on the cradle such that the mirror 62 moves with gross or fine adjustments of the object surface position, and by the expedient of altering the optical path length of the optical inspection beam, a very wide range of operating distances can be accommodated without impairing the performance of the system. In spite of adjustments in the operating distance, the geometrical inter-relationship of the incident optical beam, the spherical mirror 62, and the wafer surface 20 is not significantly altered.

Whereas the spherical mirror is preferably mechanically mounted or coupled to the object support means for the reasons above given, the primary object of the invention may be accomplished in other ways. For example, the mirror may be mounted independently of the object support.

Figure 8A:
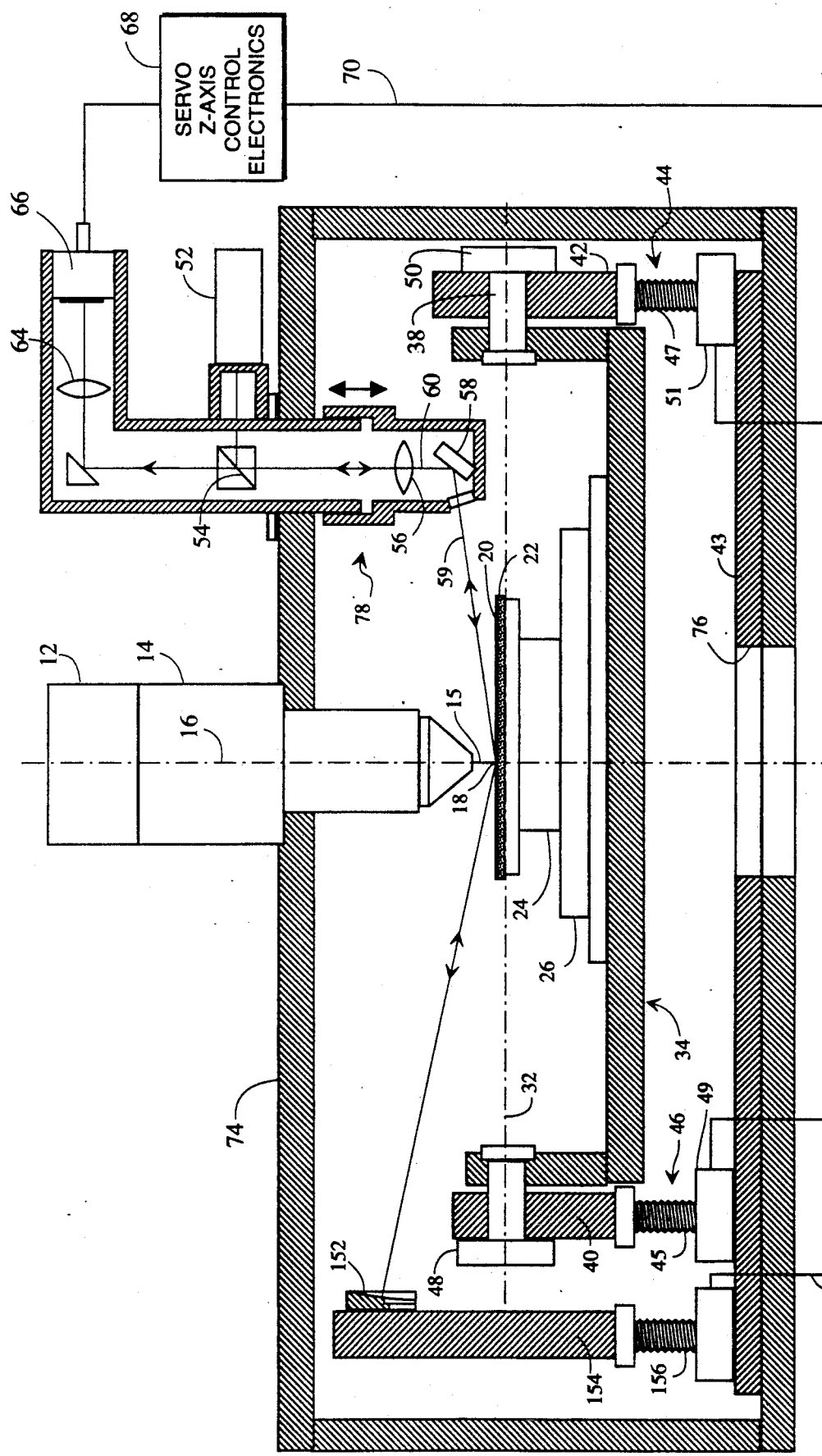
FIG. 8A illustrates an alternative embodiment of the invention.

FIG. 8A reveals an alternative embodiment wherein spherical mirror 152 is not mounted on cradle 34 but rather is mounted independently thereof. The FIG. 8A embodiment is similar to the FIG. 3 embodiment, except that spherical mirror 152 is mounted on a support 154 adapted for precise vertical position adjustment by means of a Z-motion stage shown schematically at 156, which may be of similar construction to the Z-motion stages 44, 46.

The height of the mirror 152 is adjusted independently of, but in close coordination with, the adjustment of the height of the cradle 34 by a signal supplied on line 70a from servo Z-axis control electronics 68. Mirror 152 may be similar in construction to mirror 126 in the FIG. 3 embodiment, shown in more detail in FIGS. 11-13.

It is yet another very important object of the present invention to provide an improved optical system for use with a probe-forming charged particle systems, which optical system is extremely flexible and versatile in use, accommodating object tilt angles of 60 degrees or more.

Figure 9:
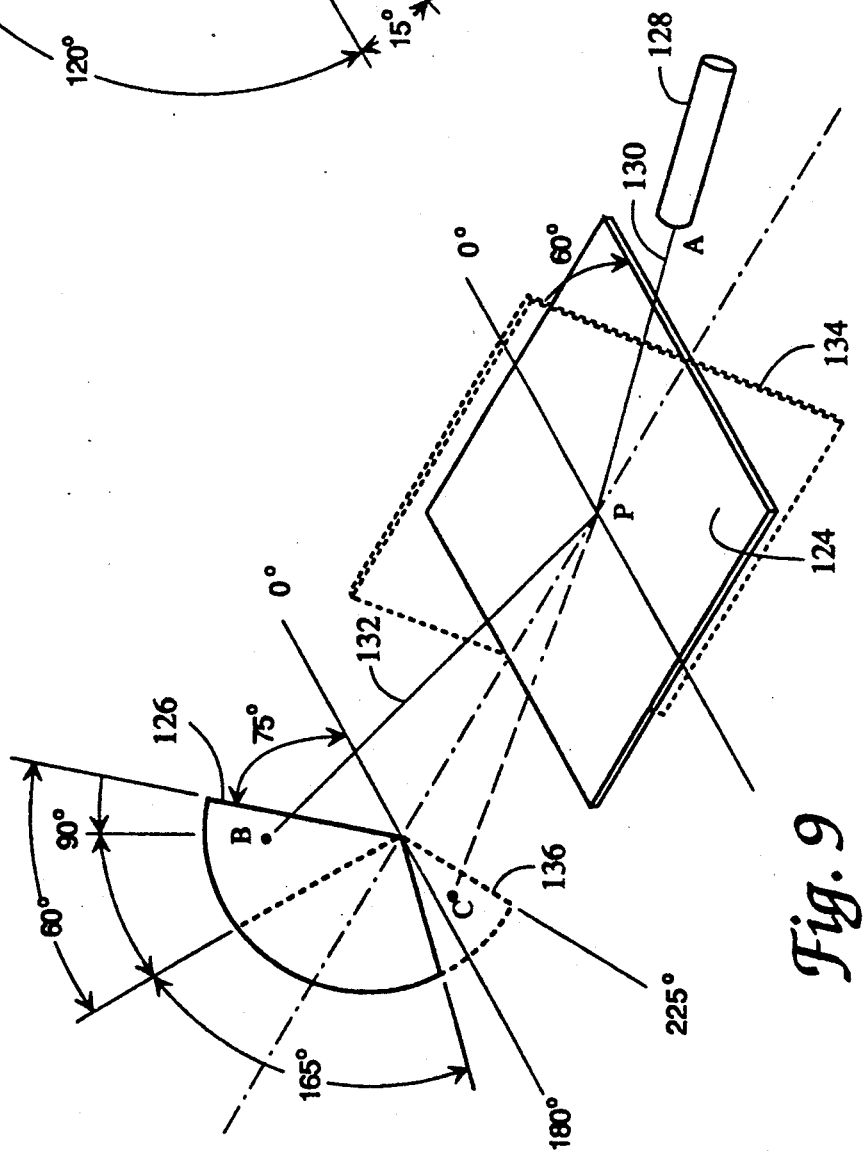

The Toro-Lira system discussed above is not useful in applications requiring tilting of the object, as it is not capable of handling object tilts greater than a few degrees due to inherent design deficiencies. One of the difficulties in accommodating great angles of tilt of the object can be better understood by reference to FIGS. 9 and 10 wherein there is shown, in highly schematic form, an object 124, spherical mirror 126 and light source 128.

Incident beam 130 is converged on object 124 at point "P". Incident beam 130 is reflected as exit beam 132 and impinges upon spherical mirror 126 at B. APB defines the plane of the beam for an object 124 at 0 degrees, as shown.

For reasons which will become evident from the ensuing discussion, the spherical mirror 126 is angularly asymmetric with respect to a plane defined by the incident and exit optical beams 130, 132. The asymmetry favors the direction of tilt of the mirror 126. In the illustrated embodiment, the spherical mirror 126 comprises a 90 degree sector with about 75 degrees on the favored side of the aforesaid plane.

Figure 10:
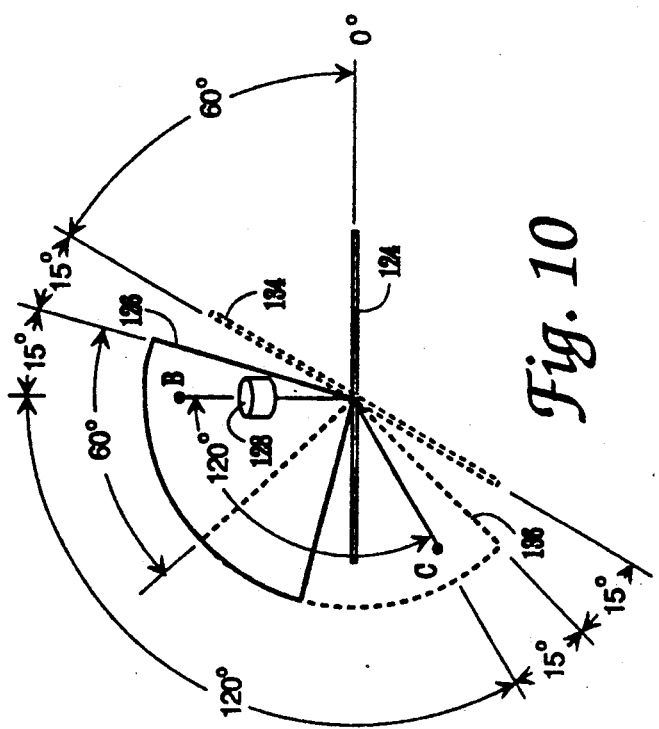
FIGS. 9 and 10 are simplified figures illustrating how object tilt angles of 60 degrees or more may be accommodated by following the principles of the present invention.

The reason for the asymmetry will now be discussed. It is based on the fact that the plane of the reflected beam 132 will be rotated through an angle which is twice the angle through which the object 124 is tilted. This will become evident from an inspection of FIG. 10. In FIG. 10 it can be seen that as the object 124 is rotated to a position shown in dotted lines at 134, 60 degrees displaced from its zero degree original position, according to the laws of equal incidence and reflection angles, the new image plane of the beam is APC. The angle of incidence is 30 degrees and the angle of reflection is 30 degrees. The spherical mirror 126 is now rotated to the dotted line position 136 and will be impinged by the reflected beam at point "C". Thus the initial beam plane, APB, is rotated to plane APC through an angle of 120 degrees as the spherical mirror 126 is tilted through 60 degrees. (Recall that the object 124 and the mirror 126 are mechanically coupled so as to rotate together). Impingement point "C" is at 210 degrees, but the mirror in its rotated position extends to 225 degrees and thus is positioned to receive the beam. For tilt angles up to 60 degrees or somewhat greater, it can be seen that the mirror 126 will collect and refocus the received beam throughout the tilt range.

The aforedescribed system was successfully implemented in an execution like FIG. 7 in which the spherical mirror had a 2.5" radius and an 8" radius of curvature. The focal length was 4". The detector 108 was a DSP IL10 from SiTek.

This system was found to have 0.236 micron resolution when a 12 bit A to D converter was used. The surface handles a range of operating distances of about 2 mm–20 mm and maintains any given operating distance within plus or minus 2 microns.

A complete specification of the mirror 126 is shown in FIGS. 11–13 at a scale of about 1.30:1. The effective optical area, bounded by dotted lines 150, is accurate to one quarter wavelength The mirror composition is Zerodur and the coating is gold.

While particular embodiments of the present invention have been shown and described it will be obvious to those skilled in the art that changes and modifications may be made without departing from the invention in its broader aspects. For example, the aforedescribed system may be adapted to a profilometric function to detail the topography of a surface, rather than to maintain an inspected surface at a prescribed operating distance from particle beam focusing optics, as illustrated and described herein.

The system is suitable for determining with precision, the exact real distance of an inspected surface from a reference point or plane.

The described autofocusing system is not limited to use in or with a focused particle beam system, but will find beneficial use in any application wherein it is desired to maintain a light-reflective surface at a given position with extreme accuracy and over a wide operating distance, particularly where the position-maintained surface is wave, or contorted, or wherein the object whose surface position is being monitored is tilted. Laser surface inspection systems are one example of such applications.

Whereas a 90 degree sector mirror is shown in the illustrated embodiment, it may be desirable in applications where space permits to use a mirror having a larger angular spread. FIG. 11 illustrates a modification of FIG. 3 wherein a 360 degree mirror 138 is employed The FIG. 11 arrangement obviates any concern for the reflected beam rot being collected by the image-forming mirror.

In the illustrated autofocusing embodiments the object position is adjusted to maintain a predetermined operating distance. Instead, the position or focal distance of the probe-forming lens in the charged particle system could be adjusted, using object surface height information derived from the output of the optical system detector.

Therefore, the appended claims are intended to cover all such changes and modifications as fall within the true spirit and scope of the invention. The matter set forth in the foregoing description and accompanying drawings is offered by way of illustration only and not as a limitation on the scope of the invention.

What is claimed is:

1. Apparatus comprising:
   a particle beam system comprising:
   particle beam generating means for forming a beam of electrons, ions or other particles, and for directing said beam along a predetermined axis of a focal point; and
   object support means for supporting an object on said axis with said focal point on a surface of said object; and
   in an autofocusing system for maintaining the relative positions of said beam generating means and said object support means along said particle beam axis, an optical beam system comprising:
   means for developing an optical beam;
   means for directing said optical beam transversely to said particle beam axis and at an acute angle to said object surface and for forming an optical beam first focus on a surface of said object; and
   a spherical mirror with its center of curvature on said object surface at said first focus for collecting radiation from said optical beam first focus and for forming a beam second focus in the vicinity of said beam first focus such that a change in the height or vertical position of said object surface along said axis produces a change in the position of said second focus indicative of said object surface height or position change.

2. The apparatus defined by claim 1 wherein said object support means includes Z-motion stage means for making adjustments in the operating distance between said particle beam generating means and said object surface along said axis, and wherein said means for directing said beam and for forming a first optical beam focus substantially on a surface of said object includes means for adjusting the optical path length of the optical beam to accommodate gross adjustments in said operating distance without substantially altering the angle of incidence of said optical beam on said object surface.

3. The apparatus defined by claim 1 wherein said object support means includes Z-motion stage means for making gross and fine adjustments in the operating distance between said particles beam generating means and said object surface along said axis, and wherein said apparatus includes means for mechanically coupling said spherical mirror to said object support means to move therewith to maintain said second focus on said surface as gross or fine adjustments in the position of said object are made.

4. The apparatus defined by claim 1 wherein said object support means includes Z-motion stage means for making gross and fine adjustments in the operating distance between said particle beam generating means and said object surface along said axis, and wherein said apparatus includes mirror support means for supporting said spherical mirror means independently of said object support means.

5. The apparatus defined by claim 1 wherein said object support means includes Z-motion stage means for making adjustments in the operating distance between said particle beam generating means and said object surface along said axis, wherein said apparatus includes means for supporting said spherical mirror for Z-axis movement in coordination with said operating distance adjustments, and wherein said means for directing said optical beam and for forming a first optical beam focus on a surface of said object includes means for adjusting the optical path length of the optical beam, whereby adjustments of the operating distance are accommodated without significantly altering the geometrical inter-relationship of said optical beam, said spherical mirror, and said object.

6. Apparatus comprising:
  a particle beam system comprising:
    particle beam generating means for forming a base of electrons, ions or other particles, and for directing said beam along a predetermined axis to a focal point; and
  object support means for supporting an object on said axis with said focal point on a surface of said object; and
  in an autofocusing system coupled to said object support means for adjusting the position of said object support means along said particle beam axis, an optical beam system comprising:
    means for developing an optical beam;
    means for directing said beam transversely to said particle beam axis and at an acute angle to said object surface and for forming an optical beam first focus on a surface of said object;
    object image forming and reflecting means for collecting radiation from said optical beam first focus and for forming a second focus in the vicinity of said beam first focus such that a change in the height or vertical position of said object surface along said axis produces a change in the position of said second focus indicative of said object surface height or position change; and
    said object support means including means for making adjustments in the operating distance between said particle beam generating means and said surface along said axis, and wherein said apparatus includes means for mechanically coupling said image-forming and reflecting means to said object support means to move therewith to maintain said second focus on said surface as any adjustments in the position of said object surface are made.

7. The apparatus defined by claim 6 wherein said image-forming means is a spherical mirror having a center of curvature on said object surface at said first focus.

8. Apparatus comprising:
  a particle beam system comprising:
    particle beam means for forming a beam of electrons, ions or other particles, and for directing said beam along a predetermined axis to a focal point; and
    object support means for supporting an object on said axis with said focal point on a surface of said object; and
  in an autofocusing system coupled to said object support means for adjusting the position of said object support means along said particle beam axis, an optical beam system comprising:
    means for developing an optical beam;
    means for directing said beam transversely to said particle beam axis and at an acute angle to said object surface and for forming a first optical beam focus on a surface of said object;
    optical image forming and reflecting means for collecting radiation from said optical beam first focus and for forming a second focus in the vicinity of said beam focus such that a change in the height or vertical position of said object surface along said axis produces a change in the position of said second focus indicative of said object surface height or position change; and
    said object support means including means for making adjustments in the operating distance between said particle beam means and said object surface measured along said axis, and wherein means for directing said beam and for forming a first optical beam focus on a surface of said object includes means for adjusting the optical path length of the optical beam to accommodate gross adjustments in said operating distance without substantially altering the angle of incidence of said optical beam on said surface.

9. The apparatus defined by claim 8 wherein said apparatus includes means for mechanically coupling said image-forming and reflecting mirror means to said object support means, and wherein said means for directing said beam and for forming a first optical beam and for forming a first optical beam focus on a surface of said object includes optical telescope means for adjusting the optical path length of the beam, whereby adjustments of the operating distance are accommodated without significantly altering the geometrical inter-relationship of said optical beam, said image-forming mirror means, and said object.

10. The apparatus defined by claim 9 wherein said image-forming and reflecting means is a spherical mirror with its center of curvature substantially on said object surface at said first focus.

11. The apparatus defined by claim 8 wherein said image-forming means is a spherical mirror with a center of curvature on said object surface of said first focus.

12. A system comprising:
  a focused particle beam system comprising:
    means for forming a beam of electrons, ions or other particles, and for directing said particle beam along a predetermined axis;
    object support means for supporting an object on said axis;
    lens means on said axis for receiving said particle beam and for forming a focus on a surface of said object; and
  a tilt-immune optical inspection system, comprising:
    means for developing an optical inspection beam;
    means for receiving said optical beam, for directing said optical beam onto said object surface along an axis forming an acute angle with said object surface, and for forming an optical first beam focus on said object surface;
    optical image-forming means for collecting radiation from said beam first focus and for forming a second focus in the vicinity of said beam first focus; and
    object support means for tilting said object about an axis parallel to said surface and substantially through said beam first focus;
    said optical image-forming means being mechanically mounted to move with said object as it is tilted by said tilting means to immunize said system from effects of tilting said object.

13. The apparatus defined by claim 12 wherein said optical image-forming means is a spherical mirror.

14. Apparatus comprising:
a particle beam system comprising:
   particle beam generating means for forming a beam of electrons, ions or other particles, and for directing said beam along a predetermined axis to a focal point; and
   object support means for supporting an object on said axis with said focal point on a surface of said object; and
in an autofocusing system for maintaining the relative positions of said beam generating means and said object support means along said particle beam axis,
an optical beam system comprising:
means for developing an optical beam;
means for directing said optical beam transversely to said particle beam axis and at an acute angle to said object surface and for forming an optical beam first focus on a surface of said object; and
optical image forming and reflecting means for collecting radiation from said optical beam first focus and for reflectively forming a beam second focus in the vicinity of said beam first focus such that a change in the height or vertical position of said object surface along said axis produces a change in the position of said second focus indicative of said object surface height or position change, said object support means including Z-motion stage means for making gross or fine adjustments in the operating distance between said particle beam generating means and said object surface along said axis, said apparatus including second support means for supporting said image-forming and reflecting means independently of said object support means, and adapted to move said image-forming and reflecting means in coordination with adjustments of said operating distance so as to maintain said second focus on said surface as gross or fine adjustments in the position of said object are made.

15. The apparatus defined by claim 14 wherein said image-forming and reflecting means is a spherical mirror with its center of curvature on said object surface substantially at said first focus.

16. Apparatus comprising:
a particle beam system comprising:
   particle beam generating means for forming a beam of electrons, ions or other particles, and for directing said beam along a predetermined axis to a focal point; and
   object support means for supporting an object on said axis with said focal point on a surface of said object; and
in an autofocusing system for maintaining the relative positions of said beam generating means and said object support means along said particle beam axis,
an optical beam system comprising:
means for developing an optical beam;
means for directing said optical beam transversely to said particle beam axis and at an acute angle to said object surface and for forming an optical beam first focus on a surface of said object; and
optical image-forming and reflecting means for collecting radiation from said optical beam first focus and for reflectively forming a beam second focus in the vicinity of said beam first focus such that a change in the height or vertical position of said object surface along said axis produces a change in the position of said second focus indicative of said object surface height or position change, said object support means including cradle means adapted to tilt about a tilt axis passing substantially along said object surface and through said particle beam focal point, and wherein said image-forming and reflecting means is mechanically coupled to said object support means to tilt therewith.

17. The apparatus defined by claim 16 wherein said image-forming and reflecting means is a spherical mirror with its center of curvature substantially on said object surface at said first focus.

18. The apparatus defined by claim 17 wherein said spherical mirror is angularly asymmetric with respect to a plane defined by incident and reflected optical beams and favors the direction of tilt of said mirror.

19. The apparatus defined by claim 18 wherein said mirror comprises a sector of approximately 90 degrees with about 75 degrees on the favored side of said plane.

20. The apparatus defined by claim 16 wherein said object support means further includes means for making gross and fine adjustments in the operating distance between said particle beam means and said object surface along said axis, and wherein said apparatus includes means for mounting said image-forming and reflecting means on said cradle means such that when adjustments are made in said operating distance, said image forming and reflecting means moves with said cradle means to maintain said second focus on said surface.

21. The apparatus defined by claim 20 wherein said image-forming and reflecting means is a spherical mirror with its center of curvature substantially on said object surface at said first focus.

22. The apparatus defined by claim 21 wherein said spherical mirror is angularly asymmetric with respect to a plane defined by incident and reflected optical beams and favors the direction of tilt of said mirror.

23. The apparatus defined by claim 22 wherein said mirror comprises a sector of approximately 90 degrees with about 75 degrees on the favored side of said plane.

24. The apparatus defined by claim 20 wherein said means for directing said beam and for forming a first optical beam focus on said surface of said object includes means for adjusting the optical path length of the beam to accommodate adjustments in said operating distance without substantially altering the angle of incidence of said optical beam on said surface.

25. An optical beam surface inspection system comprising:
means for developing an optical beam;
means for directing said optical beam at an acute angle to a surface of an object and for forming a first optical beam focus on said surface of said object; and
optical image-forming mirror means for collecting radiation from said optical beam first focus and for forming a beam second focus in the vicinity of said beam first focus such that a change in the height or vertical position of said object surface along said axis produces a change in the position of said second focus indicative of said object surface height or position change, said system including cradle means supporting said object and adapted to tilt about a tilt axis passing substantially along said object surface, said image-forming mirror means being mechanically coupled to said cradle to tilt therewith.

26. The apparatus defined by claim 25 wherein said image-forming mirror means is a spherical mirror with its center of curvature on said object surface substantially at said first focus.

27. The apparatus defined by claim 26 wherein said mirror comprises a sector of approximately 90 degrees with about 75 degrees on the favored side of said plane.

* * * * *